(12) United States Patent
Cavallucci (10) Patent No.: US 7,221,462 B2
(45) Date of Patent: May 22, 2007

(54) METHOD AND DEVICE FOR OPTICAL DETECTION OF THE POSITION OF AN OBJECT

(75) Inventor: Gilles Cavallucci, Nimes (FR)

(73) Assignee: H2I Technologies, Societe Anonyme a Directoire et Conseil de Surveillance, Nimes (FR)

( * ) Notice: Subject to any disclaimer, the term of this patent is extended or adjusted under 35 U.S.C. 154(b) by 380 days.

(21) Appl. No.: 10/481,560

(22) PCT Filed: Jun. 19, 2002

(86) PCT No.: PCT/FR02/02111

§ 371 (c)(1),
(2), (4) Date: Jun. 28, 2004

(87) PCT Pub. No.: WO03/003580

PCT Pub. Date: Jan. 9, 2003

(65) Prior Publication Data

US 2004/0246105 A1    Dec. 9, 2004

(30) Foreign Application Priority Data

Jun. 21, 2001 (FR) .................................. 01 08186

(51) Int. Cl.
*G01B 11/14* (2006.01)

(52) U.S. Cl. ...................................... 356/614; 356/609

(58) Field of Classification Search ........ 356/607–608, 356/614–615, 622, 625–629, 632–640; 250/548, 250/557, 572, 559.06, 559.22, 559.24, 559.12
See application file for complete search history.

(56) References Cited

U.S. PATENT DOCUMENTS

| | | | |
|---|---|---|---|
| 4,311,990 A | | 1/1982 | Burke |
| 4,854,707 A | * | 8/1989 | Ring et al. .................. 356/496 |
| 4,986,662 A | | 1/1991 | Bures |
| 5,031,154 A | * | 7/1991 | Watanabe ....................... 367/8 |
| 5,305,092 A | * | 4/1994 | Mimura et al. ............. 356/609 |
| 5,329,458 A | * | 7/1994 | Unno et al. ................. 700/195 |
| 5,841,542 A | * | 11/1998 | Milana et al. .............. 356/635 |

(Continued)

FOREIGN PATENT DOCUMENTS

EP     0 506 039 A2    3/1992

(Continued)

*Primary Examiner*—Sang H. Nguyen
(74) *Attorney, Agent, or Firm*—Cohen Pontani Lieberman & Pavane LLP (57) ABSTRACT

The present invention relates to a method and to a device enabling data to be input, and also to an optical system for detecting the position of an article or a member and suitable for being used (or incorporated) in such a method (or device). The technical field of the invention is that of making keyboards and similar devices enabling manual input of data for processing by a digital computer. The method of the invention for determining the position of an article in a zone uses the steps of structuring a neural network by training, applying data to the input of the structured neural network, the data being the result of converting signals delivered by a plurality of detectors sensitive to illumination of said zone, and determining the position of the article in the zone as a function of at least one data item output by the structured neural network.

13 Claims, 4 Drawing Sheets

U.S. PATENT DOCUMENTS 6,922,254 B2 * 7/2005 Blohm et al. ............... 356/638
6,956,506 B2 * 10/2005 Mantyjarvi et al. ........... 341/22

FOREIGN PATENT DOCUMENTS

| EP | 0 559 357 A1 | 9/1993 |
| FR | 2 443 173 | 11/1979 |
| GB | 2 133 537 A | 7/1984 |

\* cited by examiner

FIG.2

METHOD AND DEVICE FOR OPTICAL DETECTION OF THE POSITION OF AN OBJECT

PRIORITY CLAIM

This is a U.S. national stage of application No. PCT/FR02/02111, filed on 19 Jun. 2002. Priority is claimed on that application and on the following application(s): Country: France, Application No.: 01/08186, Filed: 21 Jun. 2001.

FIELD OF THE INVENTION

The present invention relates to a method and to a device enabling data to be input, and also to a system for optically detecting the position of an article or a member and suitable for being used or incorporated in such a method or device.

The technical field of the invention is that of making keyboards and similar devices enabling manual input of data for processing by a digital computer.

BACKGROUND OF THE INVENTION

Numerous optical systems exist that are used for detecting the position of a member or an article in order to input data, and in particular alphanumeric data.

French patent FR 2 443 173 describes a keyboard having moving keys and a plurality of light sources and light sensors enabling key depressions to be detected; that keyboard is expensive since it requires large numbers of mechanical components and of optoelectronic components; it is also complex because of the way the light sources and sensors are spread throughout the zone in which the keys are situated.

More recently, static devices (having no moving keys) have been developed for inputting data.

Document GB-A-2 133 537 describes a system for optically detecting the position of a user's finger on a screen; that system comprises sources emitting diverging light beams in order to increase the resolution of the system without multiplying the number of emitters and detectors.

U.S. Pat. No. 4,986,662 describes a system similar to the preceding system in which the sources are placed at the focal point of a parabolic reflector in order to decrease the number of optoelectronic components.

A drawback of those devices results from the fact that they require optical components (sources, detectors, and where necessary reflectors) to be placed in substantially distributed manner around the perimeter of the input zone (or monitored zone), and for this to be done with sufficient geometrical accuracy to avoid falsifying the calculations performed on the basis of data representative of the signals delivered by the detectors in order to determine the position in the input zone of an obstacle (finger, etc.) serving to define the data selected by the user. As a result, those devices remain relatively expensive.

Document EP 0 559 357 describes an alarm system including a "photoelectric barrier" type detector device constituted by two posts standing on the ground and fitted with four emitters producing four superposed infrared beams, and corresponding receivers which detect when the beams are interrupted by articles passing through the infrared barrier. The system for processing the binary signals delivered by the detectors comprises in succession: a multiplexer; a graphics generator representing interruptions of the infrared beams by the passage of a man, an animal, or an article; a preprocessor; a neural network; a comparator; a controller connected to an alarm; and a display and/or printer device. After a period of training, the neural network can be used to recognize by comparison the type of an article from among a predetermined set of article types (man, animal, vehicle), as a function of the graphics representation generated from the signals detecting interruptions of the superposed infrared beams.

That system is not designed to determine the position of an article in the monitored zone; nor is it suitable for so doing since neither the emitters nor the detectors cover the entire zone that is to be monitored.

Document EP 0 506 039 describes a device for detecting the position of the cutting edge 8a, 8b of a cutter tool 8 relative to a V-notch in a plate.

For this purpose, the device comprises a laser source directed towards the V-slot separating the cutting edge from the edge of the reference plate, an optical system responsive to the fringes that result from the laser beam being diffracted by the slot, and a neural network for determining the position of the cutting edge on the basis of signals delivered by the optical system; the optical system comprises either three series of photodiodes in alignment, or else a CCD camera.

The use of diffraction fringes from a laser beam is not applicable to detecting the position of a finger in a zone of determined outline insofar as the presence of a finger does not lead to the presence of diffraction fringes.

OBJECTS AND SUMMARY OF THE INVENTION

An object of the invention is to remedy, at least in part, the drawbacks of known methods, devices, and systems for optically detecting the position of a finger (or of a pointer article) within a zone of predetermined outline.

An object of the invention is to improve such methods, devices, and systems in order to facilitate application thereof to a static data input terminal such as a keyboard.

To this end, the invention consists in digitizing the signals delivered by photodiodes sensitive to the lighting of the input zone (or detection zone) in order to obtain data representative of said signals, and in processing said data by a classifier which is preferably essentially constituted by a neural network structured to output one or more data items characteristic of the position of the article and/or of the input data.

The input zone may be illuminated by a light source that is external to the system; it may comprise natural or artificial ambient light; nevertheless, the system of the invention preferably incorporates at least one light source, and generally a plurality of light sources for lighting the input zone.

Thus, in one aspect, the invention provides a method of detecting the position of an article in a zone (having two or three dimensions) defined by an outline, a surface, or a volume, in which:

the zone is illuminated by a first plurality of light emitters;

a second plurality of photodetectors sensitive to the light emitted by the emitters is placed in and/or around the zone;

the signals output by the photodetectors are converted into data;

the data resulting from this conversion is applied, possibly after reprocessing, to the input layer of a neural network (comprising a third plurality of input neurons), the network also having an outlet layer (possibly comprising a fourth plurality of output neurons); and the output data delivered by the output layer is used to determine one or more data items characteristic of the position of the article belonging to a subzone of predetermined outline and/or surface (or volume) within each zone, and where appropriate the input data corresponding to said subzone is deduced therefrom.

In another aspect of the invention, a device for optically determining the position of an article comprises:

a first plurality of generally identical photoemitters suitable for emitting radiation of wavelength(s) situated in the ultraviolet (UV), visible, or infrared (IR) range;

a second plurality of generally identical photodetectors each suitable for outputting an electrical signal as a function of the received light radiation;

converter means connected to said photodetectors to convert the (analog) signals delivered by the photodetectors into (digital) data; and a neural network having an input layer receiving the data delivered by said converter means, possibly after preprocessing of said data, the architecture of the neural network being such that the data delivered at the output of the network via said output layer consists in (or represents) either the coordinates of said article in said zone, or else data characteristic of the position of said article belonging to a predetermined portion of said zone.

In a fourth aspect, the invention consists in proposing a machine, or system, for processing data and comprising an input terminal for inputting data selected from a fifth plurality of predetermined data items, by means of an article or a finger approaching or contacting a zone of a substrate having a sixth plurality of portions of subzones corresponding respectively to said predetermined data items, said machine comprising:

photoemitters such as light-emitting diodes (LEDs) disposed to illuminate said zone;

photoreceivers such as photodiodes disposed to be sensitive to the radiation emitted by at least some of the photoemitters;

means for responding to the signals delivered by the photoreceivers to generate data characteristic of said signals, and where appropriate the states of said photoemitters in order to apply said data to the input neurons of a neural network; and a classifier, such as a neural network, adapted to output at least one data item identifying one of said subzones.

In other words, the invention relies on using a neural network (or equivalent classifier means) to respond to the digitized signals from the photoreceivers by determining which of the subzones or zone portions has been approached or touched by a non-transparent article forming an obstacle to radiation from at least one of the photoemitters.

By means of the invention, and unlike prior art devices, it is not necessary for the photoemitters and the photoreceivers to be disposed all around the outline of the illuminated (input) zone. Nor is it necessary for the emitters and receivers to be aligned in rows and columns. Nor is it necessary for them to be regularly spaced apart relative to one another. It suffices that, taken together, the emission lobes from the emitters illuminate all of said zone, and that the reception lobes of the receivers, taken together, also cover all of said zone. These advantages are the result in particular of the non-linearity of the data processing performed by the neurons of a neural network.

In practice, and in particular for a plane zone of rectangular outline, the result is that there is no need to place photoemitters and photoreceivers along a short side and along a long side of the outline. It becomes possible to place emitters along a curved line and/or at spacing that varies. It is also possible to place some of the emitters outside the outline of the zone and to place other emitters inside said outline. The same applies to the receivers.

It further results that it is possible to use emitters and receivers that are disposed in a determined spatial configuration with input zones of a plurality of different shapes and/or with various different kinds of zoning. This is the result in particular of the step of training the neural network prior to using the network operationally. The generally supervised step of training the neural network also makes it possible, where appropriate, to structure the network so as to enable it to distinguish between (and/or recognize) authorized input and non-authorized input. Particularly when the article is a finger, it is possible to structure the network for this purpose by training and by performing successive examples of input with a first finger that is authorized and then with some other finger that is not authorized.

In addition to its data-recognition functions, the use of a neural network thus makes it possible to make the spatial configuration of the emitters and receivers independent to some extent from the spatial configuration of the input zone and the way in which it is subdivided into subzones. In particular, the invention makes it easier to provide a static rectangular terminal or keyboard in which the emitters and receivers are grouped together along a single edge of the keyboard by providing a reflector along the opposite edge, or else in which they are grouped together along two opposite edges thereof.

The invention makes it easier to detect the position of an article on a zoned substrate that is not plane.

The invention also makes it easier to provide a keyboard whose subzones in the input zone are of different shapes and/or spacings.

A particular consequence of the invention is that the fineness (or resolution) of detection is not proportional to the number of detectors even though it does increase with an increase in said number. Furthermore, the accuracy and/or the resolution of detection increases strongly with the number of examples (also referred to as "samples") used during the stage of supervised training of the network. In practice, one or several hundreds (or thousands) of examples will generally be used for training purposes.

In comparison with known devices, the invention thus generally makes it possible to reduce the number of emitters and receivers needed.

For this purpose, in addition and preferably, the emitters are caused to emit light in pulses, and the light pulses from the emitters are mutually phase-shifted. For example, the emitters may be distributed in two groups and all of the emitters in a first group can be caused to emit simultaneously and then switched off, followed by all of the emitters in the second group emitting simultaneously and then being switched off. This enables each receiver to distinguish a first data item corresponding to the signal output the receiver while the first group of emitters is emitting, and a second data item corresponding to the signal output by the same receiver while the second group of emitters is emitting. This data from all of the receivers can be grouped together and applied simultaneously to the input of the neural network. For a given position of the article in the zone, the network is thus provided with twice as much data compared with all of the emitters emitting simultaneously. This increases the fineness of the classification (and the recognition) performed by the network, and consequently increases detection resolution without increasing the number of emitters and/or receivers.

In practice, this method can be taken much further by causing each of the emitters to emit in succession (with or preferably without overlap between successive emitted light pulses), and by adapting the structure of the neural network, in particular by increasing the number of neurons constituting the input layer.

Contrary to known optical systems for detecting the position of an article in a detection zone, in which calculating position relies on a mathematical model essentially constituted by a system of linear equations, and in which the article is taken to be a mere opaque screen forming a shadow when it is situated in the input zone, the method, the device, and the system of the invention make it possible to take account of the real optical and geometrical characteristics of the article (and/or the user's finger), in particular its ability to transmit, reflect, and/or backscatter light, and also to take account of its shape.

The neural network can be implemented in hardware form, but it is preferably constituted by one or more software modules such as those proposed under the name MATLAB by MATHWORKS (USA).

In general, the number of emitters lies in the range 2 to 500, in particular 5 to 50, and the number of receivers is situated in a range that is identical or similar thereto.

The number of neurons in the output layer may be at least 2, in particular when the network delivers output in the form of two (or three) coordinates, (Cartesian, cylindrical, or polar, for example), for the position of the article in the zone; alternatively, the number may be not less than the number of subzones in the zone when each output neuron of the network outputs binary data representative of whether or not the position of the article belongs to each of the predetermined subzones in the zone. Alternatively, the number of output neurons may be equal to unity when the network includes means for encoding the detected position.

The means for preprocessing the signals delivered by the detectors—or the data that results from conversion of said signals—may incorporate filter means and/or means for selecting useful signals/data. Such selection means can be provided for selectively eliminating signals (or corresponding data) presenting a high noise/signal ratio. This can occur, in particular, when one of the photodetectors is not sensitive to illumination of the input zone by one of the photoemitters, which can apply in particular when a photodetector is disposed in the immediate vicinity of a photoemitter that emits in non-omnidirectional manner, and when the receiver is situated in part of the space that is not illuminated by the emitter. It can be said that the detector is "blind" with respect to that emitter, being situated in a zone of shadow relative thereto.

If the signal delivered by the blind detector is applied together with the signals delivered by the "sighted" detectors, i.e. the useful detectors, to the input of the neural network, then that can lead both during training and during recognition by the network to a large amount of instability and/or error in the output. That is why it is preferable to eliminate such noisy signals and to apply to the input of the neural network only data that corresponds to signals from useful detectors. For this purpose, the device of the invention preferably incorporates a table or matrix for selecting useful signals as a function of the emitter under consideration. Consequently, the number of neurons in the input layer of the network is generally equal to the product of the number of emitters (or groups of emitters) that are switched on in succession multiplied by the (maximum) number of useful receivers.

In order to enable data input and/or detection to be performed at a rate that is sufficient, the signals delivered by the receivers and the processing of the resulting data by the neural network is performed several times per second, in particular several tens, hundreds, or thousands of times per second.

The number of intermediate layers in the network connecting the input layer to the output layer, and the number of neurons in said intermediate layers are selected prior to beginning training. The synaptic weights of the connections between neurons are determined by the training.

In practice, several intermediate layers or several tens of intermediate layers, each comprising several neurons or several tens of neurons suffice in numerous applications.

In a preferred embodiment, the emitters and receivers are disposed in alternating and/or interleaved manner along two portions of the outline of the input zone, thus serving to further improve the compactness and the simplicity of their mechanical interaction, and/or to optimize coverage of the detection zone as a function of the directivity of the emitters and the receivers.

The invention provides a method and a device for detecting position that is very simple, compact, and inexpensive.

BRIEF DESCRIPTION OF THE DRAWINGS

Other advantages and characteristics of the invention will be understood on reading the following description given with reference to the accompanying drawings which show preferred embodiments of the invention that are not limiting in any way.

MORE DETAILED DESCRIPTION

Figure 3:
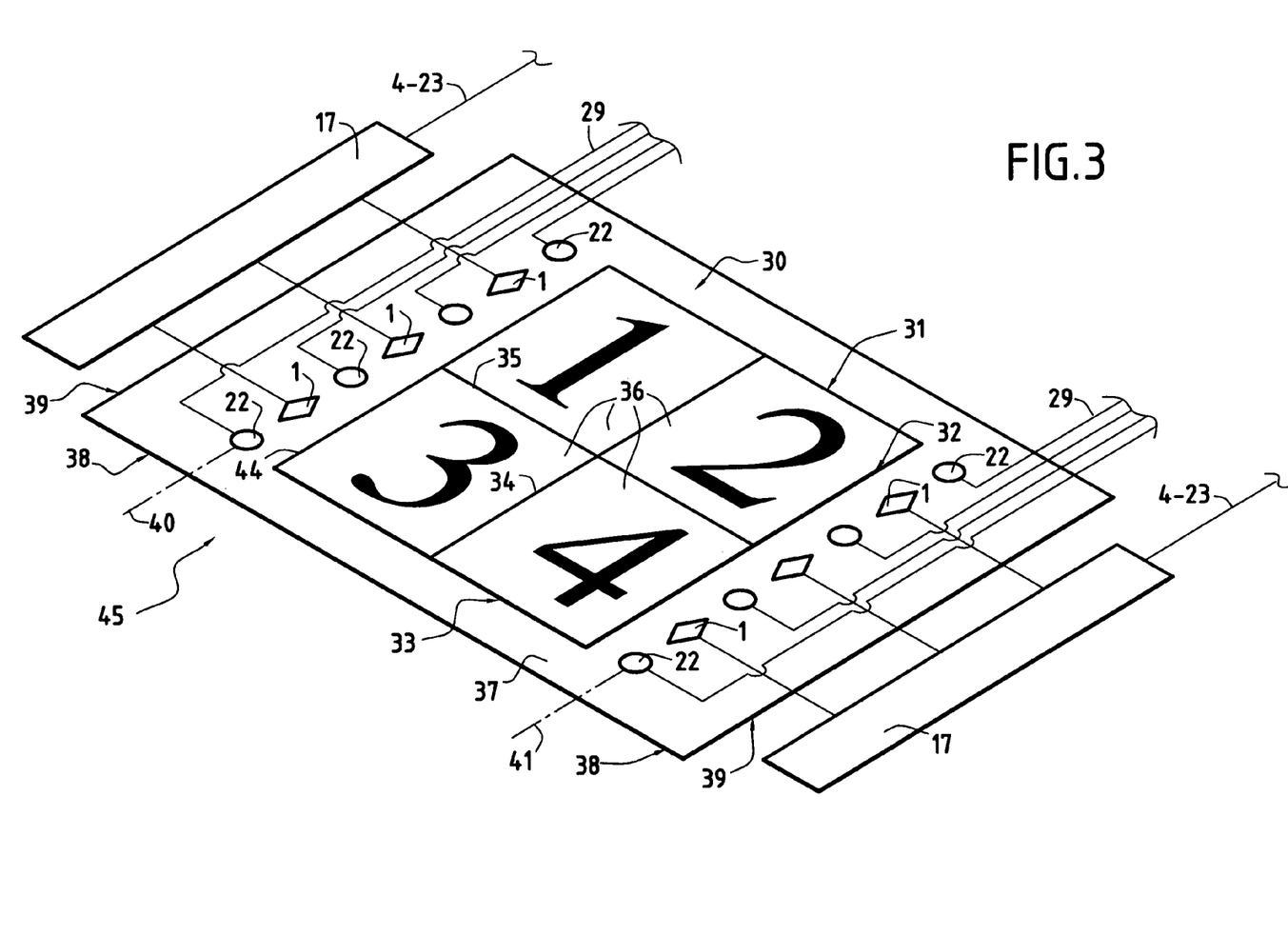
FIG. 3 is a diagrammatic perspective view of a keyboard in a device of the invention.
Figure 4:
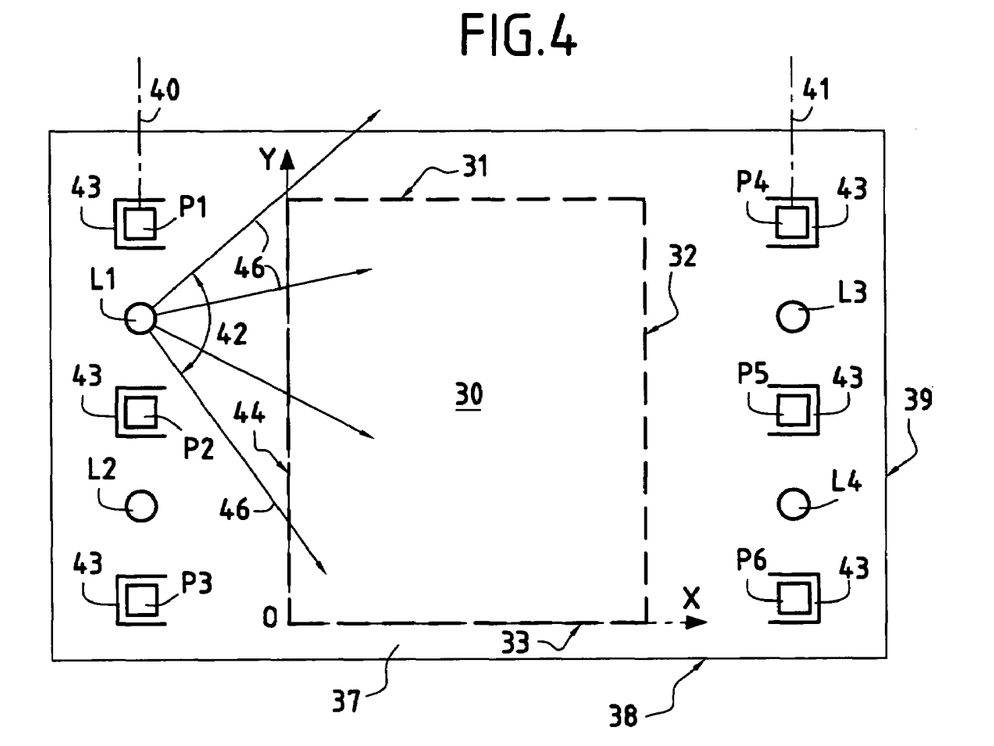
FIG. 4 is a diagrammatic plan view showing the disposition of four LEDs and six photodiodes in a detector device of the invention.

With reference to FIGS. 3 and 4, the invention applies in particular to determining the position of a member such as a user's finger or a writing tool or pointer such as a stylus which is brought close to or put into contact with a zone 30 of a substrate 37. The rectangular zone 30 is defined by four rectilinear segments 31, 32, 33, and 34 that are orthogonal in pairs. In FIG. 3, the zone 30 is subdivided into four rectangular subzones 36 defined by said segments and also by two segments 34 and 35 in a cross-configuration. Four alphanumeric symbols "1", "2", "3, and "4" are written on the substrate 37 in respective ones of the subzones 36, thereby constituting four predetermined data items that can be input by an operator.

To this end, the terminal 45 (FIG. 3) has three photodiodes 1 disposed in a regularly spaced-apart configuration along an axis 40 parallel to the segments 32, 34, and 44, and to the short sides 39 of the substrate 37. The terminal also has four LEDs 22 regularly spaced-apart along the axis 40 in alternation with the sensors 1. A second group of three sensors 1 and of four emitters 22 is disposed along a second axis 41 parallel to the axis 40. The emitters 22 and the receivers 1 are mounted in fixed positions relative to the substrate and can be disposed substantially flush with the surface of the substrate, or at a distance above the surface. In FIG. 4, the emitters are referenced L1 to L4, and the receivers are referenced P1 to P6.

The light sources 22, L1 to L4 emit radiation 46 (FIG. 4) in a conically-shaped fraction of space centered on the source and presenting an angle 42 that is preferably sufficient for the emission lobe from each source to cover the entire zone 30.

A mask 43 is associated with each sensor to protect it from parasitic light radiation.

Given the interleaved disposition in two parallel rows of the sources and of the sensors, and given the directional nature of the emission from each source, some of the sensors are blind to some of the sources. Thus, the sensors P1 to P3 (FIG. 4) are blind—in transmission—for each of the two sources L1 and L2, while the sensors P4 to P6 are blind for each of the two sources L3 and L4.

Consequently, when the light-emitting diode L1 is switched on while the light-emitting diodes L2 to L4 are switched off, for example, the output signals from the sensors P1 to P3 are constituted essentially by noise when the article to be detected in the zone 30 reflects or backscatters little. In order to ensure that the processing of the data that results from converting the signals from the sensors P1 to P6 is not "polluted" with the "noisy" data coming from the sensors P1 to P3, the corresponding signals and/or data are eliminated. This selection is performed by weighting the signals by coefficients of "zero" or of "unity" as shown in the table constituting FIG. 5. When L1 is activated on its own, the signals delivered by P4 to P6 are selected as being useful while the signals delivered by P1 to P3 are eliminated. The same applies when L2 is switched on alone. Selection weighting is inverted when L3 or L4 is switched on.

Alternatively, if the article to be detected in the zone 30 reflects or backscatters to a large extent, the means for selecting useful signals can be given parameters accordingly: the sensors P1 to P3 are blind—in reflection—for each of the sources L3 and L4, while the sensors P4 to P6 are blind—in reflection—for each of the sources L1 and L2. The corresponding weighting table or matrix would then have coefficients that are the inverses of the coefficients in the table of FIG. 5. "Zero" coefficients would be replaced by "unity" coefficients, and vice versa.

Figure 5:
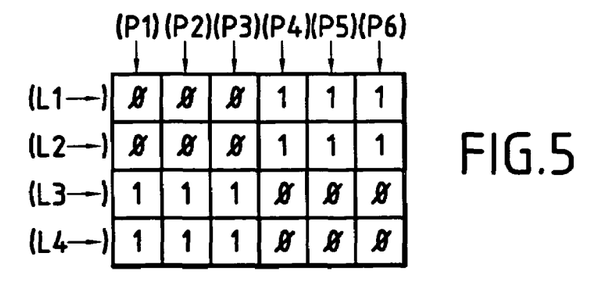
FIG. 5 shows a matrix for selecting useful detectors corresponding to the configuration of FIG. 4.

In other alternatives, the values of the respective coefficients in the table can be adapted as a function of the positions and the directivities of the emitters and the receivers, and also as a function of the particular optical properties used (transmission or reflection), and where appropriate the geometrical properties of the article to be detected.

Figure 1:
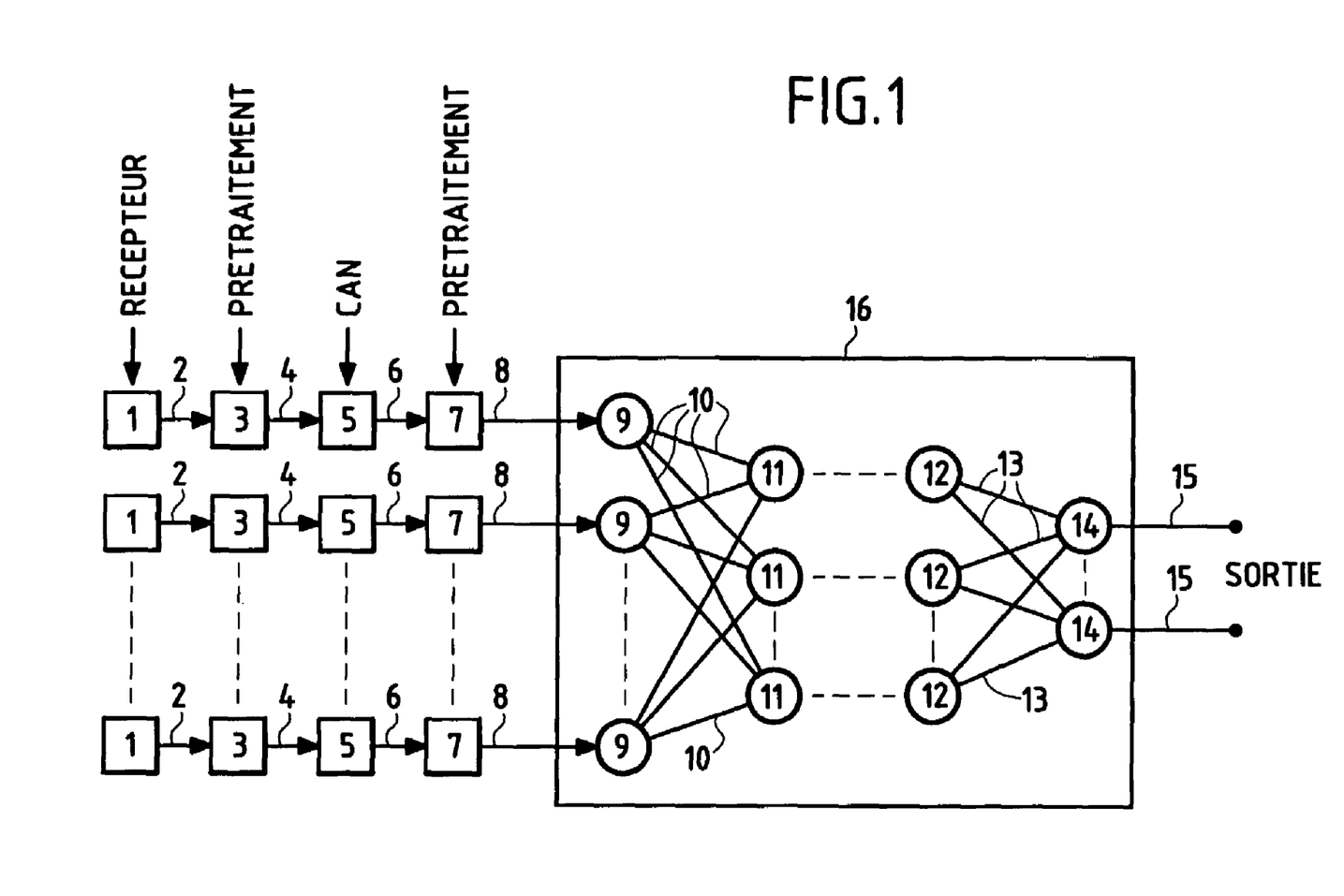
FIG. 1 is a diagram showing the main components of a first embodiment of a device of the invention.
Figure 2:
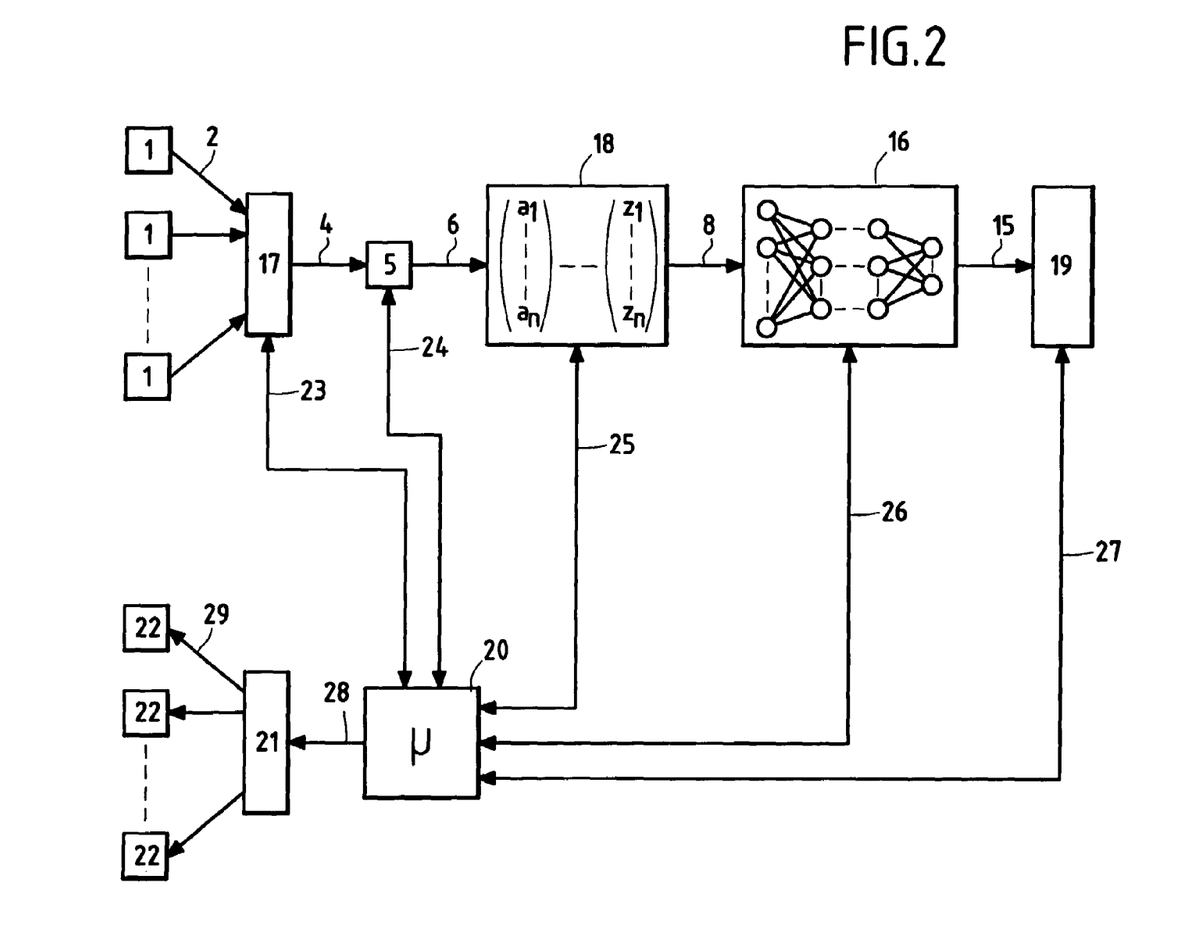
FIG. 2 is a diagram of a second embodiment of a device of the invention.

With reference to FIGS. 1 and 2 in particular, each of the sensors 1 is connected to a neural network 16 (also known as a multilayer "perception") by various means connected in series.

In FIG. 1, the output from each sensor 1 is connected via a link 2 to the input of a unit 3 for preprocessing the signal delivered by the sensor, e.g. a filter. The output from each unit 3 is connected by a link 4 to the input of an analog-to-digital converter 5. The output from each converter 5 is connected by a link 6 to the input of a unit 7 for preprocessing the data delivered by the converter. The output from each unit 7 is connected by a link 8 to an input 9 of the network 16.

In addition to the input layer of neurons 9, the network has a plurality of intermediate layers of neurons 11, 12 and an output layer of neurons 14 which deliver to an output 15 one or more data items characterizing the position of the article to be detected in the zone 30. Synaptic links 10, 13 interconnect the neurons 9, 11, 12, 14 of the receiver 16.

In the preferred embodiment shown in FIG. 2, the signals delivered by the sensors 1 are applied to the input of a multiplexer 17 whose output is connected to a single converter 5. The data vectors $(a_1, \ldots, a_n) \ldots (Z_1, \ldots Z_n)$ that result form converting the useful signals from the sensors 1 are recorded in a memory 18, and each illumination and data acquisition sequence takes place under the control of a microprocessor control unit 20 which is connected to the members 17, 5, 7, 16, and also to an output memory 19 via links 23 to 27.

The unit 20 is also connected by a link 28 to a sequencer 21 whose operation is controlled in order to perform periodic sequences of scanning the zone 30 by means of the source 22 with light by switching on all of the sources in succession during each sequence. For this purpose, a respective link 29 connects the sequencer to each of the sources.

The invention claimed is:

1. A method of determining the position of an article in a zone of a substrate comprising a plurality of zone portions, the method comprising:
    placing a plurality of photodetectors each presenting a reception lobe in or around the zone, the set of reception lobes covering all of said zone;
    structuring a neural network by supervised training;
    applying to the input of the structured neural network data that results from converting signals delivered by said plurality of photodetectors that are sensitive to illumination of said zone; and
    determining the position of the article in the zone as a function of at least one data item output by the structured neural network, by determining which of said zone portions has been touched or approached by the article forming an obstacle to the illumination of said zone;
    wherein the supervised training is performed by presenting the input of the neural network with several hundreds or thousands of sample vectors in succession, each sample vector comprising a plurality of sample data items resulting from converting signals delivered by said plurality of photodetectors and corresponding to a plurality of different illumination conditions of said zone, and in which the zone is illuminated by a plurality of light emitters each comprising an emission lobe, the set of emission lobes illuminating all of said zone.

2. The method according to claim 1, in which, in order to produce a plurality of different lighting conditions for said zone, a plurality of sources are caused to illuminate said zone in succession, the sources emitting radiation of wavelength(s) situated in the UV, visible, or infrared range.

3. The method according to claim 1, in which useful signals are selected from amongst the signals delivered by the detectors, with signals delivered by one or more blind detectors being eliminated.

4. A device for determining the position of an article in an input or detection zone of a substrate comprising a plurality of zone portions, the device comprising:
    a plurality of light sources for illuminating the input or detection zone, each of the plurality of light sources comprising a set of emission lobes for illuminating all of said zone;
    a plurality of sensors sensitive to illumination of the zone and delivering electrical signals as a function of said illumination, each of the plurality of sensors comprising a set of reception lobes, the set of reception lobes of each of the plurality of sensors covering all of said zone;

converter means connected to the plurality of sensors and adapted to convert said signals into data; and classifier means connected to the converter means and adapted to respond to the data that results from the conversion to deliver at least one output data item characteristic of the position of the article in the zone, by determining which portion of the zone the article is touching or is approaching, said classifier means comprising a neural network structured with supervised training obtained by presenting an input of the neural network with several hundreds or thousands of sample vectors in succession, each sample vector comprising a plurality of sample data items resulting from converting signals delivered by said plurality of detectors and corresponding to a plurality of different illumination conditions of said zone by said plurality of light sources.

5. The device according to claim 4, further including light scanning means connected to the plurality of light sources and adapted to cause the plurality of light sources to be switched on in succession.

6. A data input terminal including a device according to claim 4 together with a substrate relative to which the sensors and the sources if any, are mounted in a stationary manner and serving as a support for the input zone.

7. The terminal according to claim 6, having two parallel rows of sensors and two parallel rows of sources disposed in alternation or interleaved with the sensors, and including a mask or cover associated with each sensor to protect it from parasitic light radiation.

8. The device according to claim 4, further comprising means for selecting useful signals, connected to the sensors, and adapted to eliminate signals that are noisy.

9. The device according to claim 8, wherein said means for selecting are adapted to eliminate data or signals by filtering or by weighting.

10. The device according to claim 4, further comprising means for selecting useful data, connected to the converter means, and adapted to eliminate data that result from converting noisy signals.

11. The device according to claim 4, further comprising means for selecting useful data, connected to the classifier means, and adapted to eliminate data that result from converting noisy signals.

12. The device according to claim 4, including a control unit connected to the converter means and to the classifier means, to the selector means, and to the scanner means, to control operation of said means, and also means for storing useful data corresponding to various lighting functions of the zone.

13. The device according to claim 12, wherein said means for storing useful data are in the form of a memory containing a table of useful data grouping together the signal conversion data from each useful sensor in the various steps of lighting the sources in a light scan sequence.

* * * * *